United States Patent

Momiuchi et al.

[11] Patent Number: 5,825,798
[45] Date of Patent: Oct. 20, 1998

[54] LASER OSCILLATING APPARATUS AND METHOD OF DRIVING LASER BEAM SOURCE

[75] Inventors: Masayuki Momiuchi; Hiroshi Koizumi; Masahiro Ohishi; Yoshiaki Goto; Fumio Ohtomo, all of Tokyo, Japan

[73] Assignee: Kabushiki Kaisha Topcon, Tokyo, Japan

[21] Appl. No.: 650,730

[22] Filed: May 20, 1996

[30] Foreign Application Priority Data

May 19, 1995 [JP] Japan .................................. 7-145486

[51] Int. Cl.[6] .............................. H01S 3/091; H01S 3/094
[52] U.S. Cl. ................................................. 372/75; 372/22
[58] Field of Search ................... 372/22, 25, 75

[56] References Cited

U.S. PATENT DOCUMENTS 5,084,879 1/1992 Suzuki et al. .............................. 372/22
5,285,467 2/1994 Scheps ...................................... 372/75

*Primary Examiner*—Rodney B. Bovernick
*Assistant Examiner*—Robert E. Wise
*Attorney, Agent, or Firm*—Baker & Botts, L.L.P.

[57] ABSTRACT

The present invention relates to a laser oscillating apparatus using a semiconductor laser or the like and a method of driving a laser beam source. The present invention relates particularly to a laser oscillating apparatus or the like having a nonlinear optical medium for generating a second harmonic and capable of by-pulse driving a laser beam source with high efficiency. In the laser oscillating apparatus, a optical resonator is composed of at least a laser crystal and an output mirror. The nonlinear optical medium for generating the second harmonic is inserted into the optical resonator. The laser beam source can effect pumping on the optical resonator so that the period T of a drive pulse produced from a pulse driving means satisfies a relation in $\tau_{FL} > T - \tau$ with respect to $\tau_{FL}$ (fluorescence lifetime). Further, a first pulse can drive the laser beam source with the degree of not leading to the emission of a laser beam and a second pulse can drive the laser beam source so that the laser beam source produces the laser beam.

12 Claims, 8 Drawing Sheets

LASER OSCILLATING APPARATUS AND METHOD OF DRIVING LASER BEAM SOURCE

BACKGROUND OF THE INVENTION

1. Field of the Invention

The present invention relates to a laser oscillating apparatus using a semiconductor laser or the like and a method of driving a laser beam source. The present invention relates particularly to a laser oscillating apparatus having a nonlinear optical medium for generating a second harmonic and capable of by-pulse driving a laser beam source with high efficiency and a method of driving the laser beam source.

2. Description of the Related Art

A laser oscillating apparatus using a semiconductor laser has heretofore been known and applied in many fields.

With a leap forward in laser technology, a laser oscillating apparatus such as survey equipment or the like which is used outdoors under the driving power of a battery, is also now widely used as well as a laser oscillating apparatus using an ac source.

However, the battery-driven laser oscillating apparatus is accompanied by a problem that power consumption thereof is relatively increased and the time required to use it tends to be restricted.

Therefore, there has been a strong demand for a laser oscillating apparatus capable of oscillating a laser beam with high efficiency, reducing power consumption and lengthening the continuous use time thereof.

SUMMARY OF THE INVENTION

In one aspect of the present invention, there is thus provided a laser oscillating apparatus comprising an optical resonator composed of at least a laser crystal and an output mirror and in which a nonlinear optical medium for generating a second harmonic is inserted, a laser beam source for pumping the optical resonator, and pulse driving means for driving the laser beam source, wherein a period T of a drive pulse produced from the pulse driving means is capable of satisfying a relation in $\tau_{FL}>T-\tau$ with respect to $\tau_{FL}$ (fluorescence lifetime). Further, a first pulse may drive the laser beam source with the degree of not leading to the emission of a laser beam, whereas a second pulse may drive the laser beam source so that it produces the laser beam.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

The present invention will now be described with reference to the accompanying drawings wherein:

FIG. 3($b$) typically shows a gain switch and is a view showing the relationship between the time and a light intensity;

FIG. 3($c$) typically depicts a gain switch and is a view showing the relationship between the time and an inverted population;

FIGS. 5($b$) to 5($f$) are views for explaining a case in which the period T of the continuous pulse train supplied to the semiconductor laser satisfies the relation in $\tau_{FL}>T-\tau$;

FIG. 6($b$) is a view illustrating the relationship between the output of the semiconductor laser and a fundamental wave output in an optical resonator;

FIG. 6($c$) is a view depicting the relationship between the fundamental wave output in the optical resonator and a second harmonic (SHG) output at the time that a nonlinear optical medium 400 is inserted into the optical resonator;

FIG. 6($d$) is a view illustrating the relationship between the current used up by the semiconductor laser and the second harmonic (SHG) output.

DETAILED DESCRIPTION OF THE PREFERRED EMBODIMENTS

Preferred embodiments of the present invention will hereinafter be described with reference to the accompanying drawings.

Figure 1:
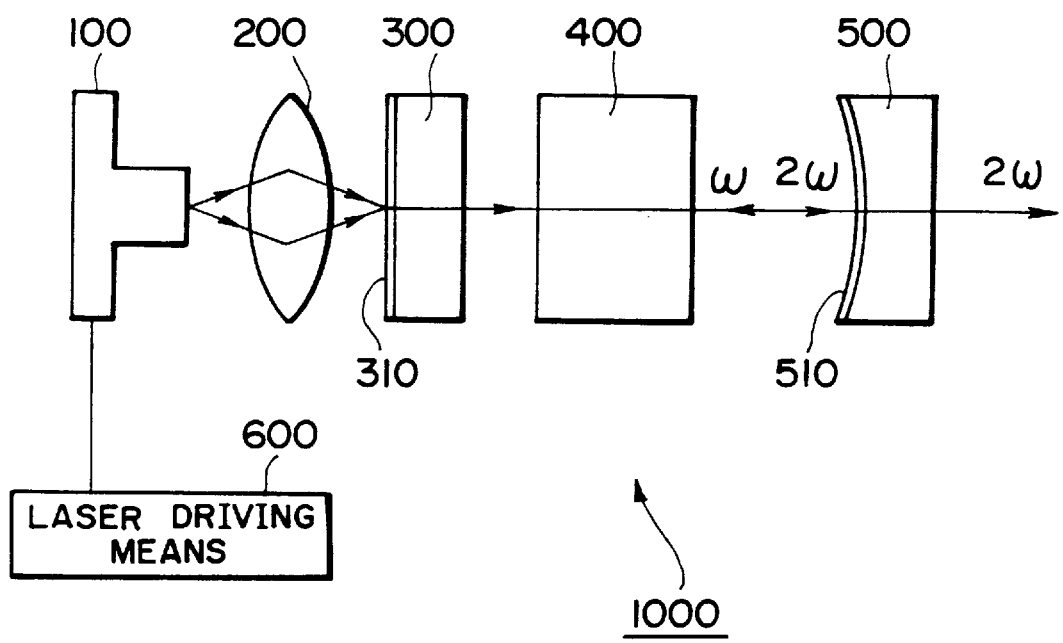
FIG. 1 is a view showing the structure of a laser oscillating apparatus 1000 according to an embodiment of the present invention.

FIG. 1 shows a laser oscillating apparatus 1000 according to the present embodiment. The laser oscillating apparatus 1000 comprises a laser beam source 100, a condenser lens 200, a laser crystal 300, a nonlinear optical medium 400, an output mirror 500 and a laser driving means 600.

The laser beam source 100 is used to generate a laser beam. In the present embodiment, a semiconductor laser is used as the laser beam source 100. In the present embodiment, the laser beam source 100 functions as a pump light generator for generating a fundamental wave. Incidentally, the laser beam source 100 is not necessarily limited to or by the semiconductor laser. Any light source means may be adopted if capable of generating a laser beam. The laser driving means 600 is used to drive the laser beam source 100. In the present embodiment, the laser beam source 100 can be pulse-driven.

The laser crystal 300 is a medium activated at a negative temperature and is used to amplify light. YAG (Yttrium Aluminum Garnet) doped with an $Nd^{3+}$ ion, and the like are used for the laser crystal 300. YAG has oscillating lines such as 946 nm, 1064 nm, 1319 nm, etc.

The laser crystal 300 is not necessarily limited to YAG. As an alternative to this, (Nd: $YVO_4$) having an oscillating line of 1064 nm, (Ti: Sapphire) having oscillating lines ranging from 700 nm to 900 nm, etc. may be used.

A first dielectric reflective film 310 is formed on the laser beam source 100 side of the laser crystal 300. The first dielectric reflective film 310 provides high permeability to the laser beam source 100 and high reflection over a wave oscillated through the laser crystal 300. Further, the first dielectric reflective film 310 also provides high reflection over SHG (SECOND HARMONIC GENERATION).

The output mirror 500 is constructed so as to be opposed to the laser crystal 300. A portion of the output mirror 500 on the laser crystal 300 side is processed in the form of a concave/spherical mirror having a suitable radius so as to form a second dielectric reflective film 510. The second dielectric reflective film 510 provides high reflection over the wave oscillated through the laser crystal 300 and high permeability to SHG (SECOND HARMONIC GENERATION).

Thus, when the first dielectric reflective film 310 of the laser crystal 300 is used in combination with the output mirror 500 so as to pump a ray or beam bundle emitted from the laser beam source 100 into the laser crystal 300 through the condenser lens 200, the light or laser beam travels between the first dielectric reflective film 310 of the laser crystal 300 and the output mirror 500 so that the laser beam can be trapped therebetween for a long time, thereby making it possible to resonate and amplify the laser beam.

In the present embodiment, the nonlinear optical medium 400 is inserted into an optical resonator composed of the first dielectric reflective film 310 of the laser crystal 300 and the output mirror 500. A nonlinear optical effect will now be described briefly.

When an electric field is applied to a substance, electric polarization is exhibited. When the electric field is low in intensity, the polarization is proportional to the electric field. However, the proportionality between the electric field and the polarization is unbalanced in the case of intense coherent light such as a laser beam. Therefore, nonlinear polarization components proportional to the square or third power of the electric field excel.

Thus, components proportional to the square of a light wave field are contained in polarization produced by a light wave in the nonlinear optical medium 400. Owing to the nonlinear polarization components, coupling is developed between light waves of different frequencies, so that a harmonic for doubling a light frequency is developed. The generation of the developed second harmonic (SHG) is called "SECOND HARMONIC GENERATION".

Since the nonlinear optical medium 400 is inserted into the optical resonator composed of the laser crystal 300 and the output mirror 500 in the present embodiment, it is called "internal SHG". Since the converted output is proportional to the square of fundamental-wave light power, an advantageous effect can be brought about that a large light intensity in the optical resonator can be directly utilized.

For example, KTP (KTiOPO$_4$:potassium titanyl phosphate), BBO ($\beta$—BaB$_2$O$_4$:$\beta$ lithium borate), LBO (LiB$_3$O$_5$:trilithim borate) or the like is used as the nonlinear optical medium 400. The nonlinear optical medium 400 is principally changed from 1064 nm to 532 nm.

Further, KNbO$_3$ (potassium niobate) or the like is used as the nonlinear optical medium 400, which is principally changed from 946 nm to 473 nm.

Referring to FIG. 1, symbol $\omega$ indicates an angular frequency of a fundamental wave and symbol $2\omega$ indicates a second harmonic (SHG).

A slight consideration will now be made of the driving of the laser oscillating apparatus 1000.

Figure 2:
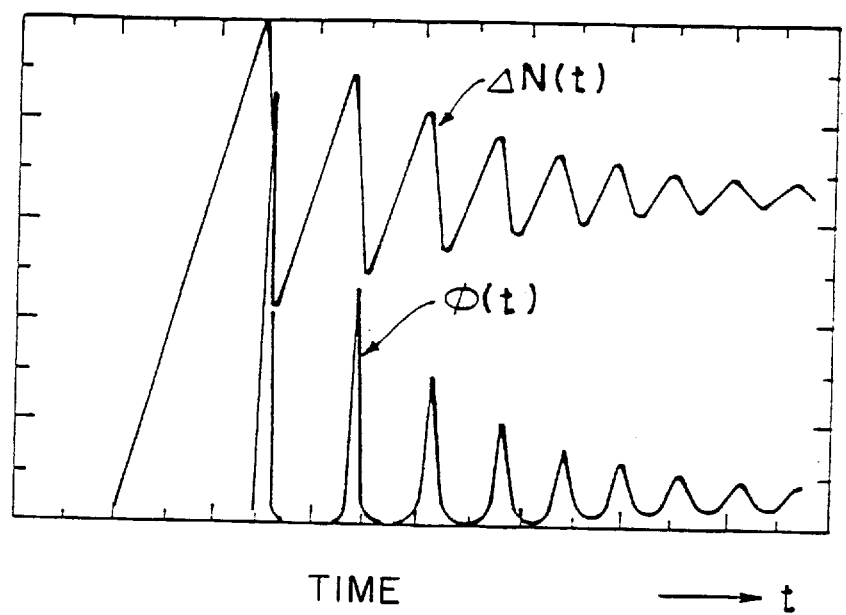
FIG. 2 is a view illustrating the relationship between an inverted population and a light intensity at the time of relaxation and vibration of a semiconductor laser.

FIG. 2 shows the relationship between an inverted population and a light intensity at the time of relaxation and vibration of a general laser beam source. A delta N(t) shown in FIG. 2 indicates an inverted population (gain), symbol $\phi$(t) indicates a light intensity, and the axis of abscissas indicates the elapse of time.

It is understood from FIG. 2 that when the inverted population reaches a maximum, the first spike (i.e., first pulse) rises so that the maximum light intensity is produced.

Figure 3A:
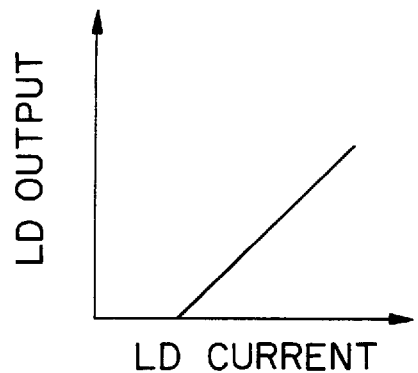
FIG. 3($a$) typically illustrates a gain switch and is a view showing the relationship between the time and an excitation strength.
Figure 3B:
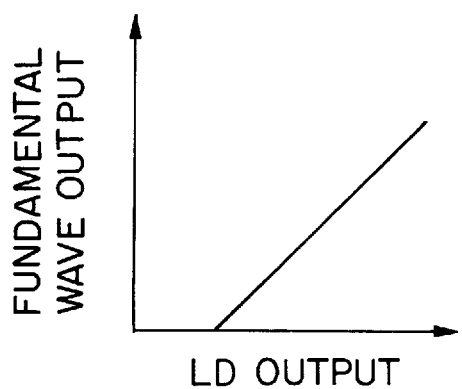
Figure 3C:
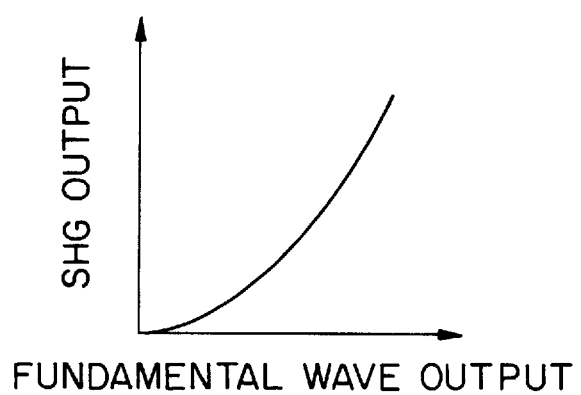

FIGS. 3(*a*), 3(*b*) and 3(*c*) respectively typically show a gain switch. FIG. 3(*a*). is a diagram showing the relationship between the time and the intensity of excitation, FIG. 3(*b*) is a diagram illustrating the relationship between the time and the intensity of light, and FIG. 3(*c*) is a diagram showing the relationship between the time and the inverted population.

It is understood from the inspection of these drawings that the maximum intensity of light occurs after the elapse of a predetermined excitation time.

Figure 4A:
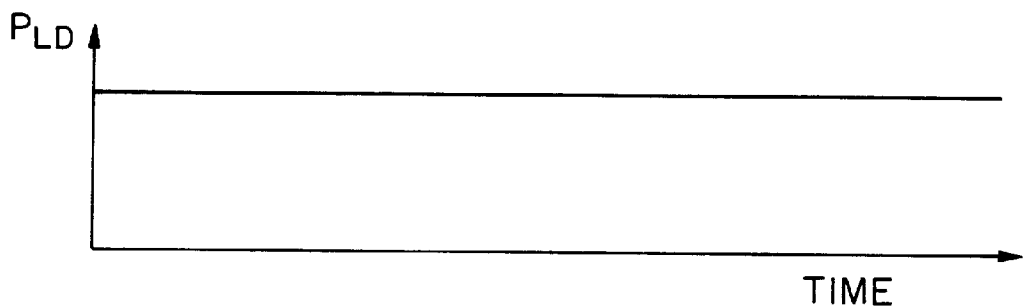
FIGS. 4($a$) to 4($c$) are views showing the relationship between an inverted population and a light intensity.
Figure 4B:
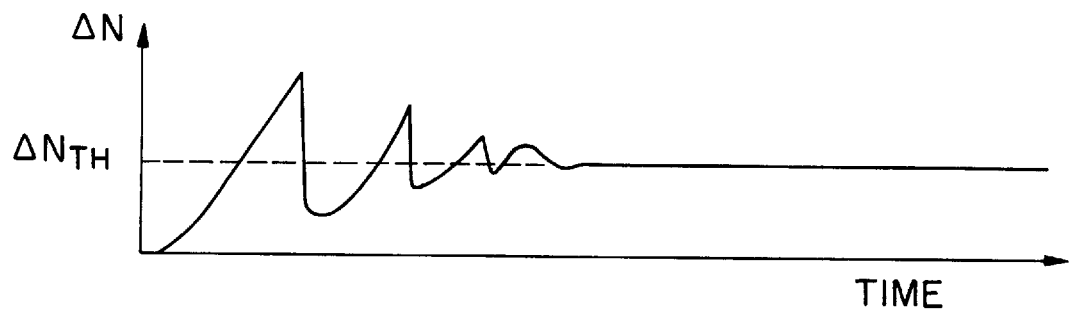
Figure 4C:
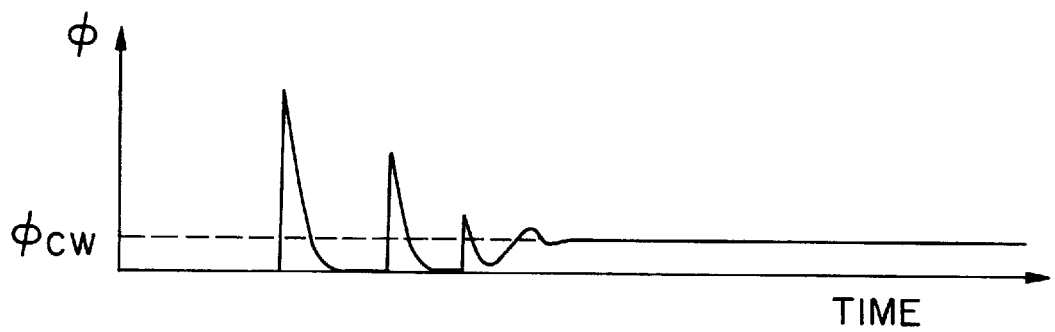
Figure 5A:
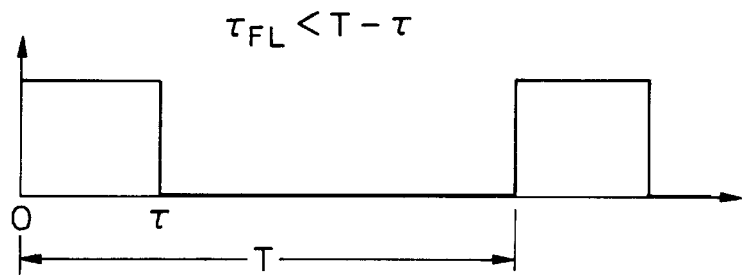
FIG. 5($a$) is a view for describing a case in which a period T of a continuous pulse train supplied to the semiconductor laser satisfies the relation in $\tau_{FL}<T-\tau$.
Figure 5B:
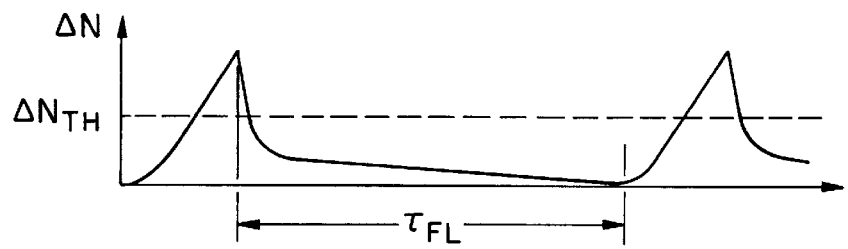
Figure 5C:
Figure 5D:
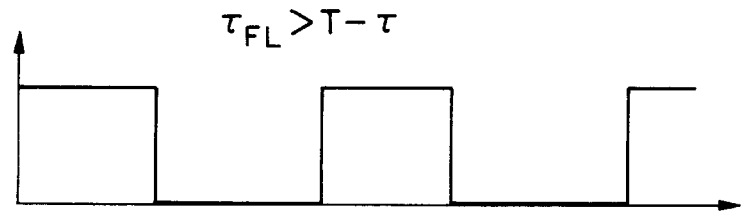
Figure 5E:
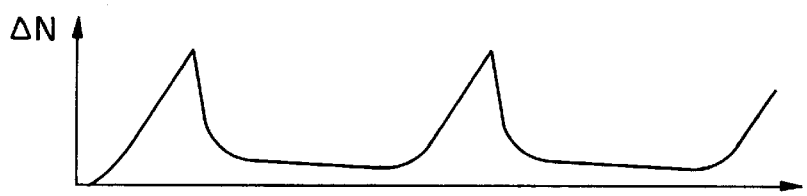
Figure 5F:
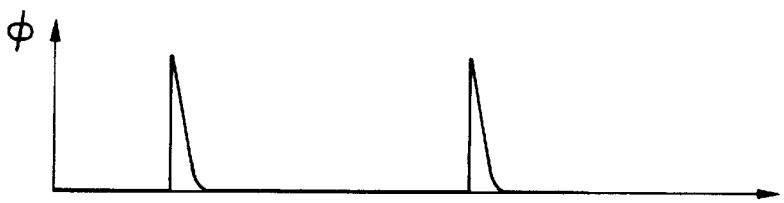
Figure 6A:
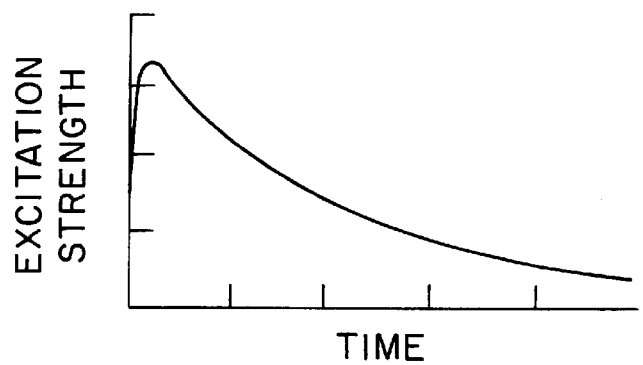
FIG. 6($a$) is a view showing the relationship between the current consumed by the semiconductor laser and the output of the semiconductor laser.
Figure 6B:
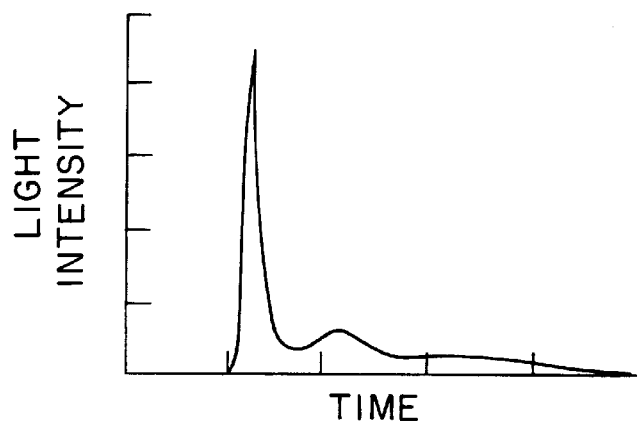
Figure 6C:
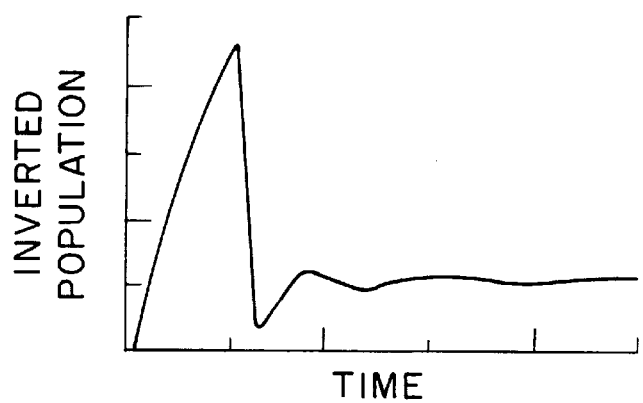
Figure 6D:
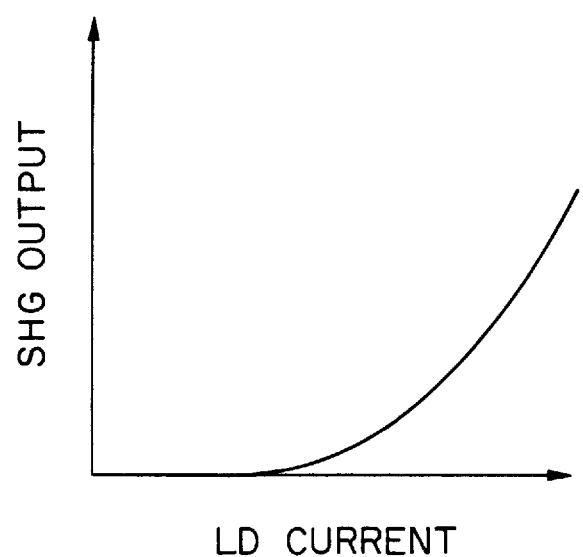

The result of separation between the inverted population and the light intensity in FIG. 2 is next shown in FIGS. 4(*a*) to 4(*c*). If continuous wave drive power is supplied to the semiconductor laser, then the maximum light intensity is produced in response to the first pulse and thereafter the light intensity is lowered so as to converge on a predetermined light intensity. It is therefore possible to extract the light with maximum efficiency. Thus, only the first pulse will be used.

A description will further be made of the case where the drive power for the continuous pulse train is supplied to the semiconductor laser, with reference to FIGS. 5(*a*) to 5(*f*).

Incidentally, a period and a pulse width output from the driving pulse which drives the semiconductor laser is approximately the same as that of the pulse beam output from the semiconductor laser.

FIGS. 5(*a*) to 5(*c*) show the case in which a period T of the continuous pulse train supplied to the semiconductor laser satisfies the relation in $\tau_{FL}$<T–$\tau$. In FIGS. 5(*a*) to 5(*c*), $\tau_{FL}$ indicates the fluorescence lifetime, and $\tau$ indicates a pulse width.

On the other hand, FIGS. 5(*d*) to 5(*f*) show the case in which the period T of the pulse train supplied to the semiconductor laser satisfies the relation in $\tau_{FL}$>T–$\tau$.

It can be understood from FIGS. 5(*d*) to 5(*f*) that the application of the next pulse to the semiconductor laser makes it possible to add a new inverted population to the remaining inverted population and effectively continuously generate only light having the maximum light intensity.

A description will now be made of the relationship between the output of the semiconductor laser and the output thereof at the time that the nonlinear optical medium 400 is inserted, on the basis of FIGS. 6(*a*) and 6(*d*).

FIG. 6(*a*) shows the relationship between the current consumed by the semiconductor laser and the output of the semiconductor laser. This relation is held linear after the flow of an offset current.

FIG. 6(*b*) illustrates the relationship between the output of the semiconductor laser and a fundamental wave output in the optical resonator. This relation is held linear after the flow of the offset current.

FIG. 6(*c*) depicts the relationship between the fundamental wave output in the optical resonator and a second harmonic (SHG) output at the time that the nonlinear optical medium 400 is inserted into the optical resonator. It is understood that the second harmonic (SHG) output is proportional to the square of the fundamental wave output in the optical resonator.

Accordingly, the second harmonic (SHG) output is proportional to the square of the current used up by the semiconductor laser as shown in FIG. 6(*d*).

Figure 7:
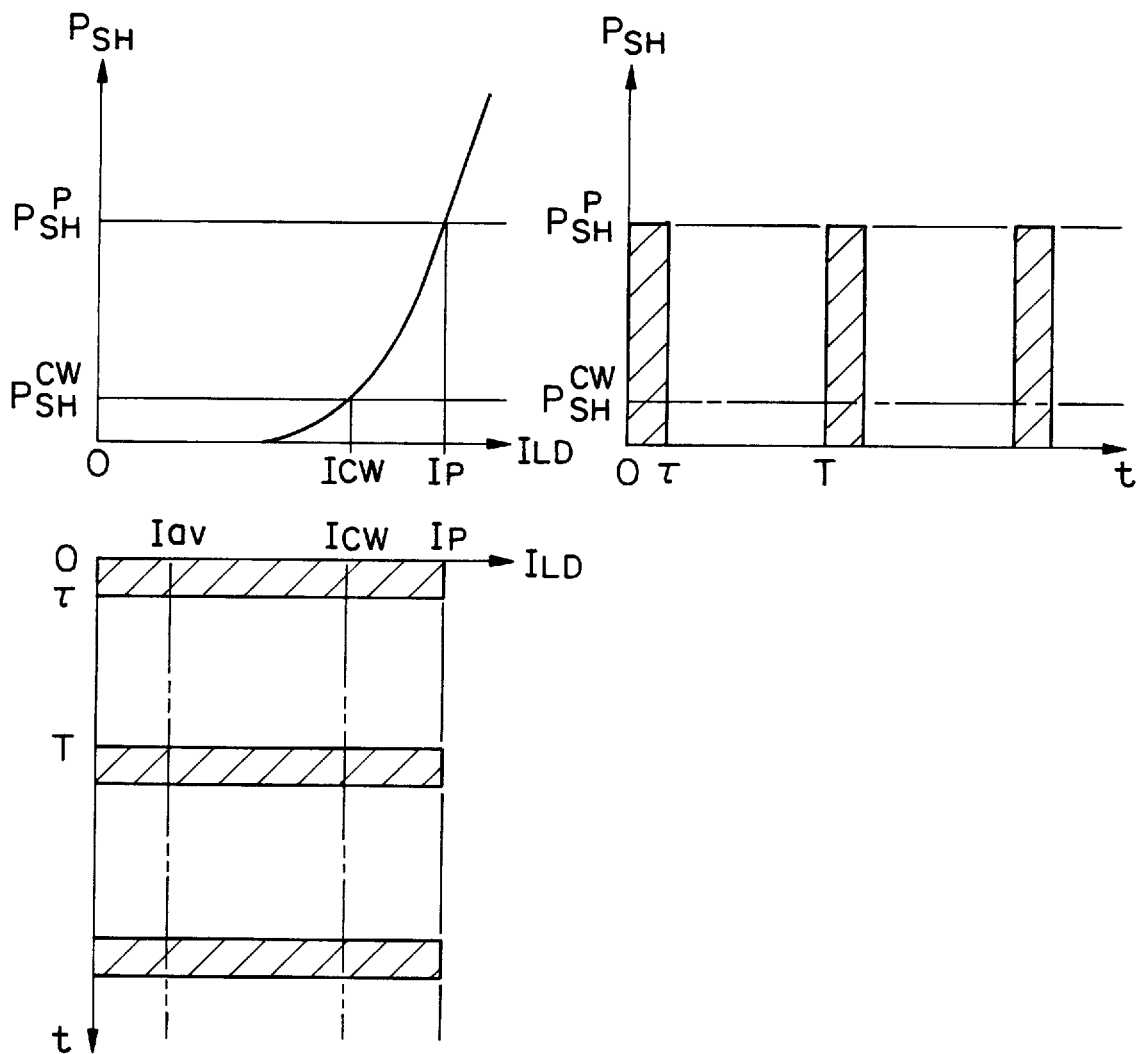
FIG. 7 is a view showing the comparison between a continuously-driven laser oscillating apparatus 1000 and a pulse-driven laser oscillating apparatus 1000 according to the present invention.

Thus, if the nonlinear optical medium 400 is inserted into the optical resonator and the laser driving means 600 drives the semiconductor laser used as the laser beam source 100 so that the next drive pulse is applied during $\tau_{FL}$ (fluorescence lifetime), then the semiconductor laser can be oscillated with high efficiency as shown in FIG. 7.

Namely, if the semiconductor laser used as the laser beam source 100 is driven in terms of a pulse width $\tau$, a pulse peak current $I_p$ and a pulse period T shown in FIG. 7, then a laser beam corresponding to a light pulse peak output $P^P_{SH}$ having a lightwave pulse width $\tau'$ is generated.

When the laser driving means 600 continuously drives the laser beam source 100 (when a continuous output $P^{CW}_{SH}$ identical to an average pulse output $P^{av}_{SH}$ is produced in this case), the second harmonic (SHG) output is proportional to the square of the current used up by the semiconductor laser if a continuous working current is regarded as $I_{CW}$. Therefore, only a laser beam corresponding to a continuous light output $P^{CW}_{SH}$ smaller than the light pulse peak output $P^P_{SH}$ is produced.

Further, since the laser beam source 100 is intermittently activated when being pulse-driven, a comparison between the pulse-driven operation and the continuous operation will be made using the average value. An average pulse current at the time of the pulse-driven operation becomes $I_{av}$ and is smaller than the continuous working current $I_{CW}$.

Thus, when the laser beam source 100 is pulse-driven to generate a laser beam corresponding to an output identical to the continuous wave, an advantageous effect can be brought about that a current of $I_{CW}-I_{av}$ can be cut down.

In the present embodiment, the laser beam source 100 is driven by intermittently supplying a single pulse thereto. However, the laser beam source 100 may be driven with two or more pulses as a set.

For example, the pulse driving means 600 can drive the laser beam source 100 with two pulses composed of first and second pulses as a set. The first pulse can drive the laser beam source 100 with the degree of not leading to the emission of a laser beam, whereas the second pulse can drive the laser beam source 100 so that it produces the laser beam.

An advantageous effect can be brought about that if the laser beam source 100 is driven with the two or more pulses as one set as described above, a light-producing time can be shortened and the life of the laser beam source 100 can be increased.

According to the present invention constructed as described above, an optical resonator is composed of at least a laser crystal and an output mirror. A laser beam source effects pumping on the optical resonator so that a pulse driving means drives the laser beam source. Since a period T of a drive pulse produced from the pulse drive means satisfies the relation in $\tau_{FL}>T-\tau$ with respect to $\tau_{FL}$ (fluorescence lifetime), an advantageous effect can be brought about that a laser beam, which is brought to the maximum light intensity owing to a first pulse, can provide pumping for the optical resonator and hence the laser beam can be emitted with high efficiency.

According to the present invention as well, an optical resonator is made up of at least a laser crystal and an output mirror. A nonlinear optical medium for generating a second harmonic is inserted into the optical resonator and a laser beam source effects pumping on the optical resonator to allow a period T of a drive pulse produced from the pulse driving means to satisfy the relation in $\tau_{FL}>T-\tau$ with respect to $\tau_{FL}$ (fluorescence lifetime). Therefore, an excellent effect can be brought about that an intense second harmonic can be generated in proportion to the square of the output of a semiconductor laser, so that a laser beam can be emitted with extremely high efficiency, whereby current consumption can be reduced so as to provide energy saving.

Further, the pulse driving means employed in the present invention drives the laser beam source with two pulses composed of first and second pulses as a set. The first pulse may drive the laser beam source with the degree of not leading to the emission of a laser beam, whereas the second pulse may drive the laser beam source to emit the laser beam.

A method of driving a laser beam source, according to the present invention by-pulse drives the laser beam source for pumping an optical resonator composed of at least a laser crystal and an output mirror in such a manner that a period T of a drive pulse satisfies the relation in $\tau_{FL}>T-\tau$ with respect to $\tau_{FL}$ (fluorescence lifetime) (where $\tau$ indicates a pulse width).

Further, a method of driving a laser beam source, according to the present invention by-pulse drives the laser beam source for pumping an optical resonator including a nonlinear optical medium for generating a second harmonic and composed of at least a laser crystal and an output mirror in such a way that a period T of a drive pulse satisfies the relation in $\tau_{FL}>T-\tau$ with respect to $\tau_{FL}$ (fluorescence lifetime).

Furthermore, the drive pulse employed in the method of the present invention drives the laser beam source with the two pulses composed of first and second pulse as one set. The first pulse can drive the laser beam source with the degree of not leading to the emission of a laser beam, whereas the second pulse can drive the laser beam source to emit the laser beam. It is therefore possible to bring about an advantageous effect that a light-producing time can be shortened and the life of the laser beam source can be increased.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A laser oscillating apparatus comprising:

an optical resonator comprising at least a laser crystal and an output mirror;

a laser beam source for pumping said optical resonator, said laser beam source having associated therewith a fluorescence lifetime $\tau_{FL}$; and pulse driving means for driving said laser beam source, said pulse driving means producing a series of pulses with a period T, each of said pulses having a pulse width of $\tau$;

wherein the fluorescence lifetime $\tau_{FL}$, the period T, and the pulse width $\tau$ are related such that $\tau_{FL}>T-\tau$.

2. The laser oscillating apparatus of claim 1, wherein each pulse of said series of pulses is of sufficient width to produce an emission of a laser beam from said laser beam source.

3. A laser oscillating apparatus comprising:

an optical resonator comprising at least a laser crystal and an output mirror;

a nonlinear optical medium inserted into said optical resonator, for generating a second harmonic;

a laser beam source for pumping said optical resonator, said laser beam source having associated therewith a fluorescence lifetime $\tau_{FL}$; and pulse driving means for driving said laser beam source, said pulse driving means producing a series of pulses with a period T, each of said pulses having a pulse width of $\tau$;

wherein the fluorescence lifetime $\tau_{FL}$, the period T, and the pulse width $\tau$ are related such that $\tau_{FL} > T - \tau$.

4. The laser oscillating apparatus of claim 3, wherein each pulse of said series of pulses is of sufficient width to produce an emission of a laser beam from said laser beam source.

5. A method of driving a laser beam source to activate the laser beam source for pumping an optical resonator composed of at least a laser crystal and an output mirror, said laser beam source having associated therewith a fluorescence lifetime $\tau_{FL}$, said method comprising driving said laser beam source with a series of pulses having a period T, each of said pulses having a pulse width of $\tau$; wherein the fluorescence lifetime $\tau_{FL}$, the period T, and the pulse width $\tau$ are related such that $\tau_{FL} > T - \tau$.

6. The method of claim 5, wherein each pulse of said series of pulses is of sufficient width to produce an emission of a laser beam from said laser beam source.

7. A method of driving a laser beam source to activate the laser beam source for pumping an optical resonator including a nonlinear optical medium for generating a second harmonic and composed of at least a laser crystal and an output mirror, said laser beam source having associated therewith a fluorescence lifetime $\tau_{FL}$, said method comprising driving said laser beam source with a series of pulses having a period T, each of said pulses having a pulse width of $\tau$; wherein the fluorescence lifetime $\tau_{FL}$, the period T, and the pulse width $\tau$ are related such that $\tau_{FL} > T - \tau$.

8. The method of claim 7, wherein each pulse of said series of pulses is of sufficient width to produce an emission of a laser beam from said laser beam source.

9. A laser oscillating apparatus comprising:

an optical resonator comprising at least a laser crystal and an output mirror;

a laser beam source for pumping said optical resonator, said laser beam source having associated therewith a fluorescence lifetime $\tau_{FL}$; and means for driving said laser beam source with a periodic series of pulses having a period T, each period of said periodic series of pulses comprising two or more pulses as a pulse set, said pulse set having a pulse set width $\tau$, said pulse set not producing the emission of a laser beam from said laser beam source until the last pulse of said pulse set;

wherein the fluorescence lifetime $\tau_{FL}$, the period T, and the pulse set width $\tau$ are related such that $\tau_{FL} > T - \tau$.

10. The laser oscillating apparatus of claim 9, further comprising a nonlinear optical medium inserted into said optical resonator, for generating a second harmonic.

11. A method of driving a laser beam source to activate the laser beam source for pumping an optical resonator composed of at least a laser crystal and an output mirror, said laser beam source having associated therewith a fluorescence lifetime $\tau_{FL}$, said method comprising driving said laser beam source with a periodic series of pulses having a period T, each period of said periodic series of pulses comprising two or more pulses as a pulse set, said pulse set having a pulse set width $\tau$, said pulse set not producing the emission of a laser beam from said laser beam source until the last pulse of said pulse set; wherein the fluorescence lifetime $\tau_{FL}$, the period T, and the pulse width $\tau$ are related such that $\tau_{FL} > T - \tau$.

12. The method of claim 11, further including a nonlinear optical medium inserted into said optical resonator.

\* \* \* \* \*